US009977097B1

(12) United States Patent
Nguyen et al.

(10) Patent No.: US 9,977,097 B1
(45) Date of Patent: May 22, 2018

(54) MICRO-SCALE PIEZOELECTRIC RESONATING MAGNETOMETER (71) Applicant: HRL Laboratories, LLC, Malibu, CA (US)

(72) Inventors: Hung Nguyen, Los Angeles, CA (US); Logan D. Sorenson, Agoura Hills, CA (US); David T. Chang, Calabasas, CA (US); Raviv Perahia, Calabasas, CA (US); Deborah J. Kirby, Calabasas, CA (US); Richard J. Joyce, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 9 days.

(21) Appl. No.: 14/628,182

(22) Filed: Feb. 20, 2015

Related U.S. Application Data (60) Provisional application No. 61/943,213, filed on Feb. 21, 2014.

(51) Int. Cl.
*G01R 33/028* (2006.01)

(52) U.S. Cl.
CPC .................. *G01R 33/0283* (2013.01)

(58) Field of Classification Search
CPC ........................................... H03H 9/19
See application file for complete search history.

(56) References Cited

U.S. PATENT DOCUMENTS

| 392,650 A | 11/1888 | Watrous |
| 2,487,165 A | 11/1949 | Miller |

(Continued)

FOREIGN PATENT DOCUMENTS

| DE | 44 42 033 | 5/1996 |
| DE | 19719601 | 11/1998 |

(Continued)

OTHER PUBLICATIONS

Aaltonen, T. et al., "ALD of Rhodium thin films from Rh (acac) 3 and Oxygen" Electrochemical and Solid State Letters, 8, C99-101 ( 2005).

(Continued)

*Primary Examiner* — Noam Reisner
(74) *Attorney, Agent, or Firm* — Ladas & Parry (57) ABSTRACT

A magnetometer has a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop. First and second oscillators are provided, the first oscillator being coupled to the loop for applying an oscillating current to the loop, the oscillating current having a frequency essentially equal to the resonant frequency of the first mode of the resonating structure, the second oscillator being coupled to said sense electrodes, the second oscillator oscillating with a fundamental frequency corresponding to the resonant frequency of the second mode of the resonating structure, the second oscillator also producing sidebands indicative of the magnetometer sensing an external magnetic field.

22 Claims, 5 Drawing Sheets

(56) References Cited

U.S. PATENT DOCUMENTS

| | | |
|---|---|---|
| 3,390,287 A | 6/1968 | Sonderegger |
| 3,702,073 A | 11/1972 | Jacobs |
| 3,766,616 A | 10/1973 | Staudte |
| 4,364,016 A | 12/1982 | Tanski |
| 4,426,769 A | 1/1984 | Grabbe |
| 4,442,574 A | 4/1984 | Wanuga |
| 4,447,753 A | 5/1984 | Ochiai |
| 4,618,262 A | 10/1986 | Maydan |
| 4,870,313 A | 9/1989 | Hirama et al. |
| 4,898,031 A | 2/1990 | Oikawa et al. |
| 4,944,836 A | 7/1990 | Beyer et al. |
| 5,085,079 A | 2/1992 | Holdren |
| 5,203,208 A | 4/1993 | Bernstein |
| 5,226,321 A | 7/1993 | Varnham |
| 5,260,596 A | 11/1993 | Dunn et al. |
| 5,421,312 A | 6/1995 | Dawson |
| 5,445,008 A | 8/1995 | Wachter |
| 5,480,747 A | 1/1996 | Vasudev |
| 5,530,408 A | 6/1996 | Vig et al. |
| 5,552,016 A | 9/1996 | Ghanayem |
| 5,578,976 A | 11/1996 | Yao et al. |
| 5,589,724 A | 12/1996 | Satoh et al. |
| 5,596,243 A | 1/1997 | Tsuru |
| 5,604,312 A | 2/1997 | Lutz |
| 5,605,490 A | 2/1997 | Laffey et al. |
| 5,644,083 A | 7/1997 | Newell |
| 5,644,139 A | 7/1997 | Allen |
| 5,646,346 A | 7/1997 | Okada |
| 5,648,849 A | 7/1997 | Canteloup |
| 5,658,418 A | 8/1997 | Coronel |
| 5,665,915 A | 9/1997 | Kobayashi |
| 5,666,706 A | 9/1997 | Tomita et al. |
| 5,668,057 A | 9/1997 | Eda et al. |
| 5,719,324 A | 2/1998 | Thundat |
| 5,728,936 A | 3/1998 | Lutz |
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,928,532 A | 7/1999 | Koshimizu |
| 5,942,445 A | 8/1999 | Kato et al. |
| 5,959,206 A | 9/1999 | Ryrko |
| 5,959,207 A | 9/1999 | Letrondo |
| 5,981,392 A | 11/1999 | Oishi |
| 5,987,985 A | 11/1999 | Okada |
| 6,009,751 A | 1/2000 | Ljung |
| 6,033,852 A | 3/2000 | Andle |
| 6,044,705 A | 4/2000 | Neukermans |
| 6,049,702 A | 4/2000 | Tham et al. |
| 6,081,334 A | 6/2000 | Grimbergen |
| 6,089,088 A | 7/2000 | Charvet |
| 6,094,985 A | 8/2000 | Kapels et al. |
| 6,114,801 A | 9/2000 | Tanaka et al. |
| 6,145,380 A | 11/2000 | MacGugan |
| 6,151,964 A | 11/2000 | Nakajima |
| 6,155,115 A | 12/2000 | Ljung |
| 6,164,134 A | 12/2000 | Cargille |
| 6,182,352 B1 | 2/2001 | Deschenes |
| 6,196,059 B1 | 3/2001 | Koesslinger |
| 6,204,737 B1 | 3/2001 | Ella |
| 6,207,008 B1 | 3/2001 | Kijima |
| 6,236,145 B1 | 5/2001 | Biernacki |
| 6,250,157 B1 | 6/2001 | Touge |
| 6,263,552 B1 | 7/2001 | Takeuchi |
| 6,282,958 B1 | 9/2001 | Fell et al. |
| 6,289,733 B1 | 9/2001 | Challoner |
| 6,297,064 B1 | 10/2001 | Koshimizu |
| 6,335,667 B1 | 1/2002 | Takagi |
| 6,336,366 B1 | 1/2002 | Thundat |
| 6,349,597 B1 | 2/2002 | Folkmer |
| 6,367,326 B1 | 4/2002 | Okada |
| 6,367,786 B1 | 4/2002 | Gutierrez |
| 6,413,682 B1 | 7/2002 | Shibano |
| 6,417,925 B1 | 7/2002 | Naya |
| 6,424,418 B2 | 7/2002 | Kawabata |
| 6,426,296 B1 | 7/2002 | Okojie |
| 6,429,652 B1 * | 8/2002 | Allen ............... G01C 17/28 324/259 |
| 6,432,824 B2 | 8/2002 | Yanagisawa |
| 6,481,284 B2 | 11/2002 | Geen et al. |
| 6,481,285 B1 | 11/2002 | Shkel et al. |
| 6,492,195 B2 | 12/2002 | Nakanishi |
| 6,513,380 B2 | 2/2003 | Reeds et al. |
| 6,514,767 B1 | 2/2003 | Natan |
| 6,515,278 B2 | 2/2003 | Wine et al. |
| 6,571,629 B1 | 6/2003 | Kipp |
| 6,584,845 B1 | 7/2003 | Gutierrez |
| 6,614,529 B1 | 9/2003 | Tang |
| 6,621,158 B2 | 9/2003 | Martin et al. |
| 6,627,067 B1 | 9/2003 | Branton |
| 6,628,177 B2 | 9/2003 | Clark et al. |
| 6,629,460 B2 | 10/2003 | Challoner |
| 6,651,027 B2 | 11/2003 | McCall |
| 6,686,807 B1 | 2/2004 | Giousouf |
| 6,710,681 B2 | 3/2004 | Figueredo |
| 6,713,938 B2 | 3/2004 | Nguyen |
| 6,715,352 B2 | 4/2004 | Tracy |
| 6,744,335 B2 | 6/2004 | Ryhanen |
| 6,750,728 B2 | 6/2004 | Takahashi |
| 6,756,304 B1 | 6/2004 | Robert |
| 6,768,396 B2 | 7/2004 | Klee et al. |
| 6,796,179 B2 | 9/2004 | Bae et al. |
| 6,806,557 B2 | 10/2004 | Ding |
| 6,815,228 B2 | 11/2004 | Usui et al. |
| 6,856,217 B1 | 2/2005 | Clark et al. |
| 6,862,398 B2 | 3/2005 | Elkind et al. |
| 6,883,374 B2 | 4/2005 | Fell et al. |
| 6,909,221 B2 | 6/2005 | Ayazi et al. |
| 6,915,215 B2 | 7/2005 | M'Closkey |
| 6,933,164 B2 | 8/2005 | Kubena |
| 6,943,484 B2 | 9/2005 | Clark et al. |
| 6,944,931 B2 | 9/2005 | Shcheglov |
| 6,953,977 B2 | 10/2005 | Mlcak |
| 6,954,020 B2 | 10/2005 | Ma et al. |
| 6,984,925 B2 | 1/2006 | Morley |
| 6,985,051 B2 | 1/2006 | Nguyen et al. |
| 7,002,281 B2 | 2/2006 | Andle |
| 7,040,163 B2 | 5/2006 | Shcheglov |
| 7,057,331 B2 | 6/2006 | Shimodaira |
| 7,118,657 B2 | 10/2006 | Goloychenko |
| 7,152,290 B2 | 12/2006 | Junhua et al. |
| 7,168,318 B2 | 1/2007 | Challoner |
| 7,211,933 B2 | 5/2007 | Kawakubo |
| 7,224,245 B2 | 5/2007 | Song et al. |
| 7,232,700 B1 | 6/2007 | Kubena |
| 7,234,214 B2 | 6/2007 | Xu |
| 7,237,315 B2 | 7/2007 | Kubena |
| 7,295,088 B2 | 11/2007 | Nguyen |
| 7,317,354 B2 | 1/2008 | Lee |
| 7,347,095 B2 | 3/2008 | Shcheglov |
| 7,401,397 B2 | 7/2008 | Shcheglov |
| 7,409,851 B2 | 8/2008 | Ilic et al. |
| 7,446,461 B2 | 11/2008 | Watanabe |
| 7,446,628 B2 | 11/2008 | Morris, III |
| 7,459,099 B2 | 12/2008 | Kubena et al. |
| 7,459,992 B2 | 12/2008 | Matsuda |
| 7,479,846 B2 | 1/2009 | Inoue et al. |
| 7,490,390 B2 | 2/2009 | Kawakubo |
| 7,493,814 B2 | 2/2009 | Whelan et al. |
| 7,543,496 B2 | 6/2009 | Ayazi |
| 7,551,054 B2 | 6/2009 | Mizuno et al. |
| 7,555,824 B2 | 7/2009 | Chang |
| 7,555,938 B2 * | 7/2009 | Bargatin ............ G01N 29/036 324/76.11 |
| 7,557,493 B2 | 7/2009 | Fujimoto |
| 7,559,130 B2 | 7/2009 | Kubena et al. |
| 7,564,177 B2 | 7/2009 | Yoshimatsu |
| 7,579,748 B2 | 8/2009 | Kuroda |
| 7,579,926 B2 | 8/2009 | Jhung |
| 7,581,443 B2 | 9/2009 | Kubena |
| 7,624,494 B2 | 12/2009 | Challoner |
| 7,647,688 B1 | 1/2010 | Chang |
| 7,663,196 B2 | 2/2010 | Liu et al. |
| 7,671,427 B2 | 3/2010 | Kim et al. |

(56) References Cited

U.S. PATENT DOCUMENTS

| | | | |
|---|---|---|---|
| 7,675,224 B2 | 3/2010 | Tanaya | |
| 7,690,095 B2 | 4/2010 | Takahashi | |
| 7,750,535 B2 | 7/2010 | Kubena | |
| 7,757,393 B2 | 7/2010 | Ayazi et al. | |
| 7,791,431 B2 | 9/2010 | Han | |
| 7,791,432 B2 | 9/2010 | Piazza et al. | |
| 7,793,541 B2 | 9/2010 | Challoner | |
| 7,802,356 B1 | 9/2010 | Chang | |
| 7,830,074 B2 * | 11/2010 | Kubena | H04R 17/10 310/348 |
| 7,836,765 B2 | 11/2010 | Challoner | |
| 7,851,971 B2 | 12/2010 | Chang | |
| 7,872,548 B2 | 1/2011 | Nishihara | |
| 7,884,930 B2 | 2/2011 | Kirby | |
| 7,895,892 B2 | 3/2011 | Aigner | |
| 7,958,781 B2 | 6/2011 | Fell | |
| 7,987,714 B2 | 8/2011 | DeNatale | |
| 7,994,877 B1 | 8/2011 | Kubena | |
| 8,138,016 B2 | 3/2012 | Chang | |
| 8,151,640 B1 | 4/2012 | Kubena | |
| 8,176,607 B1 | 5/2012 | Kubena | |
| 8,205,495 B2 | 6/2012 | Challoner | |
| 8,322,028 B2 | 12/2012 | Ge et al. | |
| 8,381,590 B2 | 2/2013 | Ikeda et al. | |
| 8,393,212 B2 | 3/2013 | Ge et al. | |
| 8,402,824 B1 | 3/2013 | Kubena | |
| 8,522,612 B1 | 9/2013 | Kubena | |
| 8,569,937 B1 | 10/2013 | Kubena | |
| 8,593,037 B1 | 11/2013 | Kubena | |
| 8,765,615 B1 | 7/2014 | Chang | |
| 8,766,745 B1 | 7/2014 | Kubena | |
| 8,769,802 B1 | 7/2014 | Chang | |
| 8,782,876 B1 | 7/2014 | Kubena | |
| 8,912,711 B1 | 12/2014 | Chang | |
| 9,038,459 B1 | 5/2015 | Kubena | |
| 9,046,541 B1 | 6/2015 | Kubena | |
| 9,061,886 B1 | 6/2015 | Nguyen | |
| 9,250,074 B1 | 2/2016 | Kubena | |
| 9,425,769 B1 | 8/2016 | White | |
| 2002/0066317 A1 | 6/2002 | Lin | |
| 2002/0072246 A1 | 6/2002 | Goo et al. | |
| 2002/0074947 A1 | 6/2002 | Tsukamoto | |
| 2002/0107658 A1 | 8/2002 | McCall | |
| 2002/0185611 A1 | 12/2002 | Menapace | |
| 2003/0003608 A1 | 1/2003 | Arikado | |
| 2003/0010123 A1 | 1/2003 | Malvern | |
| 2003/0029238 A1 | 2/2003 | Challoner | |
| 2003/0196490 A1 | 10/2003 | Cardarelli | |
| 2003/0205948 A1 | 11/2003 | Lin et al. | |
| 2004/0055380 A1 | 3/2004 | Shcheglov | |
| 2004/0055381 A1 | 3/2004 | Shcheglov | |
| 2004/0065864 A1 | 4/2004 | Vogt et al. | |
| 2004/0189311 A1 | 9/2004 | Glezer | |
| 2004/0211052 A1 | 10/2004 | Kubena et al. | |
| 2005/0024165 A1 | 2/2005 | Hsu | |
| 2005/0034822 A1 | 2/2005 | Kim et al. | |
| 2005/0056917 A1 | 3/2005 | Kwon | |
| 2005/0062368 A1 | 3/2005 | Hirasawa | |
| 2005/0093659 A1 | 5/2005 | Larson et al. | |
| 2005/0156309 A1 | 7/2005 | Fujii | |
| 2005/0172714 A1 | 8/2005 | Challoner | |
| 2005/0260792 A1 | 11/2005 | Patel | |
| 2005/0274183 A1 | 12/2005 | Shcheglov | |
| 2006/0016065 A1 | 1/2006 | Nagaura | |
| 2006/0022556 A1 | 2/2006 | Bail et al. | |
| 2006/0055479 A1 | 3/2006 | Okazaki | |
| 2006/0066419 A1 | 3/2006 | Iwaki | |
| 2006/0162146 A1 | 7/2006 | Shcheglov | |
| 2006/0197619 A1 | 9/2006 | Oishi et al. | |
| 2006/0213266 A1 | 9/2006 | French | |
| 2006/0252906 A1 | 11/2006 | Godschalx | |
| 2006/0255691 A1 | 11/2006 | Kuroda | |
| 2007/0017287 A1 | 1/2007 | Kubena | |
| 2007/0034005 A1 | 2/2007 | Acar | |
| 2007/0069605 A1 | 3/2007 | Klaasse et al. | |
| 2007/0084042 A1 | 4/2007 | Challoner | |
| 2007/0205839 A1 | 9/2007 | Kubena et al. | |
| 2007/0220971 A1 | 9/2007 | Ayazi | |
| 2007/0240508 A1 | 10/2007 | Watson | |
| 2008/0034575 A1 | 2/2008 | Chang et al. | |
| 2008/0074661 A1 | 3/2008 | Zhang et al. | |
| 2008/0096313 A1 | 4/2008 | Patel | |
| 2008/0100176 A1 | 5/2008 | Haskell | |
| 2008/0148846 A1 | 6/2008 | Whelan | |
| 2008/0295622 A1 | 12/2008 | Challoner | |
| 2009/0095077 A1 | 4/2009 | DeNatale | |
| 2009/0140356 A1 | 6/2009 | Yazdi | |
| 2009/0146527 A1 | 6/2009 | Lee et al. | |
| 2009/0189294 A1 | 7/2009 | Chang | |
| 2010/0020311 A1 | 1/2010 | Kirby | |
| 2010/0024560 A1 | 2/2010 | Shcheglov | |
| 2010/0148803 A1 | 6/2010 | Ohnishi | |
| 2010/0251817 A1 | 10/2010 | Ge et al. | |
| 2010/0251818 A1 | 10/2010 | Ge et al. | |
| 2011/0107838 A1 | 5/2011 | Suijlen | |
| 2012/0000288 A1 | 1/2012 | Matsuura | |
| 2012/0025333 A1 | 2/2012 | Yoshida | |
| 2012/0212109 A1 | 8/2012 | Yamazaki | |
| 2012/0266682 A1 | 10/2012 | Torashima | |
| 2012/0306321 A1 | 12/2012 | Ishii | |
| 2013/0313947 A1 | 11/2013 | Chen | |
| 2014/0049256 A1 | 2/2014 | Smith | |
| 2015/0188030 A1 | 7/2015 | Andosca | |
| 2015/0263432 A1 | 9/2015 | White | |
| 2016/0079884 A1 | 3/2016 | Lange | |

FOREIGN PATENT DOCUMENTS

| | | |
|---|---|---|
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247125 | 9/1997 |
| JP | 2003-318685 | 11/2003 |
| JP | 2005-180921 | 7/2005 |
| JP | 2006-352487 | 12/2006 |
| KR | 10-2001-0110428 | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

Abe, T., et al., "One-chip Multichannel Quartz Crystal Microbalance (QCM) Fabricated by Deep RIE," Sensors and Actuators, 82 (2000), pp. 139-143.

Antonio, D. et al., "Micromechanical magnetometer using an all-silicon nonlinear torsional resonator," Applied Physics Letters 95, 133505 2009 (4 pages).

Bahreyni, Behraad, et al.,"A Resonant Micromachined Magnetic Field Sensor," IEEE Sensors Journal, vol. 7, No. 9, Sep. 2007, pp. 1326 to 1334.

Barbour et al., "Micromechanical Silicon Instrument and Systems Development at Draper Laboratory," AIAA Guidance Navigation and Control Conference, 1996, Paper No. 96-3709.

Burdess et al., "The Theory of a Piezoelectric Disc Gyroscope", Jul. 1986, IEEE Transactions and Aerospace abd Electronic Systems, vol. AES 22, No. 4; p. 410-418.

(56) References Cited

OTHER PUBLICATIONS

Cleland, A.N. et al., "Fabrication of High Frequency Nanometer Scale Mechanical Resonators From Bulk Si Crystals," Applied Physics Letters, Oct. 28, 1996, pp. 2653-2655.
Evoy, S., et al. "Temperature-dependent Internal Friction in Silicon Nanoelectromechanical Systems," Applied Physics Letters, vol. 77, No. 15, Oct. 9, 2000, pp. 2397-2399.
Friedt, J.-M., et al., "Introduction to the quartz tuning fork", American Journal of Physics 75, 415 (2007), pp. 415-422.
Fujita et al., "Disk-shaped bulk micromachined gyroscope with vacuum sealing," Sensors and Actuators 82, May 2000, pp. 198-204.
Greer, J.A., et al., "Properties of SAW resonators fabricated on quartz substrates of various qualities" Ultrasonics Symposium, 1994 IEEE, vol. 1, Nov. 1-4, 1994, pp. 31-36.
Herrera-May, A L, et al."A resonant magnetic field microsensor with high quality factor at atmospheric pressure," J. Micromechanics Microengineering, 19 (2009) 015016 (11pp).
Johnson et al., "Surface Micromachined Angular Rate Sensor," 1995 SAE Conference, Paper No. 950538, pp. 77-83.
Lin, J.W., et al., "A Robust High-Q Micromachined RF Inductor for RFIC Applications," IEEE Transactions on Electronic Devices, vol. 52, No. 7, pp. 1489-1496 (Jul. 2005).
Nguyen, Hung D., et al., "UHF Piezoelectric Quartz MEMS Magnetometers Based on Acoustic Coupling of Flexural and Thickness Shear Modes," MEMS 2015, Estoril, Portugal, Jan. 18-22, 2015, pp. 944-947.
Park, K.J. et al., "Selective area atomic layer deposition of rhodium and effective work function characterization in capacitor structures," Applied Physics Letters 89, 043111 (2006), 3 pages.
Putty et al., "A Micromachined Vibrating Ring Gyroscope," Solid State Sensor and Actuator Workshop, Transducer Research Foundation, Hilton Head, South Carolina, 1994, pp. 213-220.
Sirbuly, Donald J. et al., Multifunctional Nanowire Evanescent Wave Optical Sensors, Advanced Materials, 2007 (published online: Dec. 5, 2006), 19, pp. 61-66.
Skulski et al., "Planar resonator sensor for moisture measurements", Microwaves and Radar, 1998, MIKON '98, 12th International Conf., vol. 3, May 20-22, 1998, pp. 692-695.
Sunier, R., et al., "Resonant Magnetic Field Sensor With Frequency Output," Journal of Microelectromechanical Systems, vol. 15, No. 5, pp. 1098-1107, Oct. 2006.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab, Jun. 2, 1996 (6 pages).
Thompson, M.J. "Low Power 3-axis Lorentz Force Navigation Magnetometer,", MEMS 2011, Cancun, Mexico, Jan. 23-27, 2011.
White, Lan M., et al., Increasing the Enhancement of SERS with Dielectric Microsphere Resonators, Spectroscopy-Eugene, Apr. 2006 (5 pages).
Wickenden, Dennis, et al. "Development of Miniature Magnetometers," Johns Hopkins APL Technical Digest, vol. 18, No. 2 (1997), pp. 271-278.
Wright, et al., "The HRG Applied to a Satellite Attitude Reference System," Guidance and Control, AASAAS, 1994, 86: pp. 55-67.
Yan, Fei, et al., "Surface-enhanced Raman scattering (SERS) detection for chemical and biological agents," IEEE Sensors Journal, vol. 5, No. 4, Aug. 2005 (7 pages).
From U.S. Appl. No. 14/680,902, filed Apr. 7, 2015, unpublished, non publication requested, Application and Office Actions.
From U.S. Appl. No. 12/026,486, filed Feb. 5, 2008, unpublished, non publication requested, Application and Office Actions.
From U.S. Appl. No. 11/818,797 (now published as 2010/0020311), Application and Office Actions.
From U.S. Appl. No. 12/179,579 (unpublished, non publication requested), Office Action dated Dec. 9, 2010.
From U.S. Appl. No. 13/363,174 (unpublished, non publication requested), Office Action dated Aug. 27, 2014.
From U.S. Appl. No. 13/363,174 (unpublished, non publication requested), Office Action dated Jun. 13, 2014.
From U.S. Appl. No. 10/426,931 (now U.S. Pat. No. 7,237,315), Notice of Allowance dated Feb. 1, 2007.
From U.S. Appl. No. 10/426,931 (now U.S. Pat. No. 7,237,315), Office Action dated Oct. 24, 2006.
From U.S. Appl. No. 10/426,931 (now U.S. Pat. No. 7,237,315), Office Action dated Sep. 13, 2006.
From U.S. Appl. No. 10/426,931 (now U.S. Pat. No. 7,237,315), Office Action dated Jul. 11, 2006.
From U.S. Appl. No. 10/426,931 (now U.S. Pat. No. 7,237,315), Office Action dated Jan. 20, 2006.
From U.S. Appl. No. 10/426,931 (now U.S. Pat. No. 7,237,315), Office Action dated Aug. 11, 2005.
From U.S. Appl. No. 10/426,931 (now U.S. Pat. No. 7,237,315), Office Action dated May 16, 2005.
From U.S. Appl. No. 10/426,931 (now U.S. Pat. No. 7,237,315), Office Action dated Dec. 8, 2004.
From U.S. Appl. No. 10/426,931 (now U.S. Pat. No. 7,237,315), Office Action dated Aug. 31, 2004.
From U.S. Appl. No. 10/426,931 (now U.S. Pat. No. 7,237,315), Office Action dated Jun. 16, 2004.
From U.S. Appl. No. 11/043,378 (now U.S. Pat. No. 7,459,099), Notice of Allowance dated Aug. 4, 2008.
From U.S. Appl. No. 11/043,378 (now U.S. Pat. No. 7,459,099), Office Action dated Jan. 15, 2008.
From U.S. Appl. No. 11/043,378 (now U.S. Pat. No. 7,459,099), Office Action dated Sep. 12, 2007.
From U.S. Appl. No. 11/043,378 (now U.S. Pat. No. 7,459,099), Office Action dated May 25, 2007.
From U.S. Appl. No. 11/043,378 (now U.S. Pat. No. 7,459,099), Office Action dated Dec. 6, 2006.
From U.S. Appl. No. 11/043,378 (now U.S. Pat. No. 7,459,099), Office Action dated Aug. 11, 2006.
From U.S. Appl. No. 11/458,911 (now U.S. Pat. No. 7,581,443), Notice of Allowance dated Apr. 23, 2009.
From U.S. Appl. No. 11/458,911 (now U.S. Pat. No. 7,581,443), Office Action dated Sep. 17, 2008.
From U.S. Appl. No. 11/458,911 (now U.S. Pat. No. 7,581,443), Office Action dated Jul. 2, 2008.
From U.S. Appl. No. 11/458,911 (now U.S. Pat. No. 7,581,443), Office Action dated Apr. 17, 2008.
From U.S. Appl. No. 11/458,911 (now U.S. Pat. No. 7,581,443), Office Action dated Oct. 12, 2007.
From U.S. Appl. No. 11/502,336 (now U.S. Pat. No. 7,555,824), Notice of Allowance datd Mar. 20, 2009.
From U.S. Appl. No. 11/502,336 (now U.S. Pat. No. 7,555,824), Office Action dated Jan. 23, 2009.
From U.S. Appl. No. 11/502,336 (now U.S. Pat. No. 7,555,824), Office Action dated Nov. 14, 2008.
From U.S. Appl. No. 11/800,289 (now U.S. Pat. No. 7,559,130), Notice of Allowance dated Mar. 25, 2009.
From U.S. Appl. No. 11/800,289 (now U.S. Pat. No. 7,559,130), Office Action dated Oct. 24, 2008.
From U.S. Appl. No. 11/800,294 (now U.S. Pat. No. 7,750,535), Notice of Allowance dated Nov. 30, 2009.
From U.S. Appl. No. 11/800,294 (now U.S. Pat. No. 7,750,535), Office Action dated Jul. 29, 2009.
From U.S. Appl. No. 11/881,461 (now U.S. Pat. No. 7,830,074), Notice of Allowance dated Sep. 24, 2010.
From U.S. Appl. No. 11/881,461 (now U.S. Pat. No. 7,830,074), Notice of Allowance dated Jul. 13, 2010.
From U.S. Appl. No. 11/881,461 (now U.S. Pat. No. 7,830,074), Office Action dated Jun. 2, 2010.
From U.S. Appl. No. 11/881,461 (now U.S. Pat. No. 7,830,074), Office Action dated Oct. 19, 2009.
From U.S. Appl. No. 11/881,461 (now U.S. Pat. No. 7,830,074), Office Action dated Jun. 16, 2009.
From U.S. Appl. No. 12/027,247 (now U.S. Pat. No. 8,151,640), Office Action dated Dec. 8, 2011.
From U.S. Appl. No. 12/027,247 (now U.S. Pat. No. 8,151,640), Office Action dated Jun. 7, 2011.

(56) References Cited

OTHER PUBLICATIONS

From U.S. Appl. No. 12/027,247 (now U.S. Pat. No. 8,151,640), Office Action dated Feb. 16, 2011.
From U.S. Appl. No. 12/034,852 (now U.S. Pat. No. 7,802,356), Notice of Allowance dated May 19, 2010.
From U.S. Appl. No. 12/034,852 (now U.S. Pat. No. 7,802,356), Office Action dated Jan. 28, 2010.
From U.S. Appl. No. 12/034,852 (now U.S. Pat. No. 7,802,356), Office Action dated Oct. 2, 2009.
From U.S. Appl. No. 12/145,678 (now U.S. Pat. No. 7,884,930), Notice of Allowance dated Jul. 13, 2010.
From U.S. Appl. No. 12/145,678 (now U.S. Pat. No. 7,884,930), Office Action dated Mar. 26, 2010.
From U.S. Appl. No. 12/145,678 (now U.S. Pat. No. 7,884,930), Office Action dated Jan. 14, 2010.
From U.S. Appl. No. 12/145,678 (now U.S. Pat. No. 7,884,930), Office Action dated Jul. 22, 2009.
From U.S. Appl. No. 12/268,309 (now U.S. Pat. No. 7,994,877), Notice of Allowance dated Apr. 4, 2011.
From U.S. Appl. No. 12/268,309 (now U.S. Pat. No. 7,994,877), Office Action dated Nov. 22, 2010.
From U.S. Appl. No. 12/268,309 (now U.S. Pat. No. 7,994,877), Office Action dated Aug. 20, 2010.
From U.S. Appl. No. 12/399,680 (now U.S. Pat. No. 8,138,016), Notice of Allowance dated Nov. 14, 2011.
From U.S. Appl. No. 12/399,680 (now U.S. Pat. No. 8,138,016), Office Action dated Aug. 4, 2011.
From U.S. Appl. No. 12/399,680 (now U.S. Pat. No. 8,138,016), Office Action dated Jun. 7, 2011.
From U.S. Appl. No. 12/488,784 (now U.S. Pat. No. 8,766,745), Notice of Allowance dated Feb. 20, 2014.
From U.S. Appl. No. 12/488,784 (now U.S. Pat. No. 8,766,745), Office Action dated Oct. 3, 2013.
From U.S. Appl. No. 12/488,784 (now U.S. Pat. No. 8,766,745), Office Action dated Jun. 4, 2013.
From U.S. Appl. No. 12/488,784 (now U.S. Pat. No. 8,766,745), Office Action dated Jan. 3, 2013.
From U.S. Appl. No. 12/488,784 (now U.S. Pat. No. 8,766,745), Office Action dated Aug. 1, 2012.
From U.S. Appl. No. 12/488,784 (now U.S. Pat. No. 8,766,745), Office Action dated Apr. 30, 2012.
From U.S. Appl. No. 12/575,634 (now U.S. Pat. No. 8,176,607), Notice of Allowance dated Jan. 9, 2012.
From U.S. Appl. No. 12/575,634 (now U.S. Pat. No. 8,176,607), Office Action dated Oct. 17, 2011.
From U.S. Appl. No. 12/575,634 (now U.S. Pat. No. 8,176,607), Office Action dated Jul. 11, 2011.
From U.S. Appl. No. 12/575,634 (now U.S. Pat. No. 8,176,607), Office Action dated Mar. 23, 2011.
From U.S. Appl. No. 12/820,761 (now U.S. Pat. No. 8,912,711), Notice of Allowance dated Oct. 30, 2014.
From U.S. Appl. No. 12/820,761 (now U.S. Pat. No. 8,912,711), Notice of Allowance dated Aug. 15, 2014.
From U.S. Appl. No. 12/820,761 (now U.S. Pat. No. 8,912,711), Office Action dated Jul. 1, 2014.
From U.S. Appl. No. 12/820,761 (now U.S. Pat. No. 8,912,711), Office Action dated Mar. 7, 2014.
From U.S. Appl. No. 12/820,761 (now U.S. Pat. No. 8,912,711), Office Action dated Nov. 19, 2013.
From U.S. Appl. No. 12/820,761 (now U.S. Pat. No. 8,912,711), Office Action dated Jul. 24, 2013.
From U.S. Appl. No. 12/820,761 (now U.S. Pat. No. 8,912,711), Office Action dated Mar. 19, 2013.
From U.S. Appl. No. 12/820,761 (now U.S. Pat. No. 8,912,711), Office Action dated Nov. 2, 2012.
From U.S. Appl. No. 12/820,761 (now U.S. Pat. No. 8,912,711), Office Action dated Sep. 6, 2012.
From U.S. Appl. No. 12/820,761 (now U.S. Pat. No. 8,912,711), Office Action dated Jun. 25, 2012.
From U.S. Appl. No. 12/820,761 (now U.S. Pat. No. 8,912,711), Office Action dated Feb. 23, 2012.
From U.S. Appl. No. 12/820,761 (now U.S. Pat. No. 8,912,711), Office Action dated Jan. 9, 2012.
From U.S. Appl. No. 12/831,028 (now U.S. Pat. No. 8,769,802), Notice of Allowance dated Feb. 27, 2014.
From U.S. Appl. No. 12/831,028 (now U.S. Pat. No. 8,769,802), Office Action dated Nov. 7, 2013.
From U.S. Appl. No. 12/831,028 (now U.S. Pat. No. 8,769,802), Office Action dated Apr. 11, 2012.
From U.S. Appl. No. 13/163,357 (now U.S. Pat. No. 8,782,876), Notice of Allowance dated Mar. 13, 2014.
From U.S. Appl. No. 13/163,357 (now U.S. Pat. No. 8,782,876), Office Action dated Aug. 19, 2013.
From U.S. Appl. No. 13/163,357 (now U.S. Pat. No. 8,782,876), Office Action dated Mar. 1, 2013.
From U.S. Appl. No. 13/410,998 (now U.S. Pat. No. 8,522,612), Notice of Allowance dated Apr. 11, 2013.
From U.S. Appl. No. 13/434,144 (now U.S. Pat. No. 8,593,037), Office Action dated Jul. 11, 2013.
From U.S. Appl. No. 13/648,041 (now U.S. Pat. No. 9,046,541), Notice of Allowance dated Jan. 16, 2015.
From U.S. Appl. No. 13/648,041 (now U.S. Pat. No. 9,046,541), Office Action dated Sep. 15, 2014.
From U.S. Appl. No. 13/840,160 (now U.S. Pat. No. 9,061,886), Notice of Allowance dated Feb. 20, 2015.
From U.S. Appl. No. 13/840,160 (now U.S. Pat. No. 9,061,886), Office Action dated Dec. 16, 2014.
From U.S. Appl. No. 13/840,160 (now U.S. Pat. No. 9,061,886), Office Action dated Jun. 30, 2014.
U.S. Appl. No. 14/547,057, filed Nov. 18, 2014, Kubena.
U.S. Appl. No. 14/997,203, filed Jan. 15, 2016, Sorenson.
U.S. Appl. No. 13/910,039, filed Jun. 4, 2013, Gregoire.
U.S. Appl. No. 14/997,423, filed Jan. 15, 2016, Nguyen.
Younis, Mohammad I., "Multi-Mode Excitation of a Clamped-clamped Microbeam Resonator," Nonlinear Dynamics, vol. 80, No. 3 (2015), pp. 1531-1541.
Zhang, Xuehui; et al., "FPGA-Based Multi-Frequency Excitation and Modulation Technology in EIT System," 2010 3rd International Conference on Biomedical Engineering and Informatics (BMEI 2010), pp. 907-911.
U.S. Appl. No. 12/026,486, filed Feb. 5, 2008, Kubena.
U.S. Appl. No. 12/179,579, filed Jul. 24, 2008, Kubena.
U.S. Appl. No. 13/363,174, filed Jan. 31, 2012, Kubena.
U.S. Appl. No. 14/628,076, filed Feb. 20, 2015, White.
U.S. Appl. No. 14/680,902, filed Apr. 7, 2015, Kubena.
U.S. Appl. No. 14/997,160, filed Jan. 15, 2016, Nguyen.
U.S. Appl. No. 15/083,190, filed Mar. 28, 2016, Perahia.

\* cited by examiner

MICRO-SCALE PIEZOELECTRIC RESONATING MAGNETOMETER

CROSS REFERENCE TO RELATED APPLICATIONS AND PATENTS

This application claims the benefit of U.S. Provisional Patent Application Ser. No. 61/943,213 filed Feb. 21, 2014, the disclosure of which is hereby incorporated herein by reference.

The technology disclosed in this application is related to and preferably employs the technology of U.S. Pat. No. 7,830,074 entitled "Method for Fabricating a Resonator", the disclosure of which is hereby incorporated herein by reference.

STATEMENT REGARDING FEDERALLY SPONSORED RESEARCH OR DEVELOPMENT

None

TECHNICAL FIELD

This invention relates to a quartz piezoelectric resonating magnetometer to detect magnetic fields, the sensor preferably being of micro-scale and suitable for use in handheld (portable and low power) Global Positioning System (GPS) navigation devices. The disclosed sensor may be manufactured using Micro Electro Mechanical System (MEMS) techniques, but the invention as disclosed is not conceptually limited to being of a micro-scale in size or being manufactured using MEMS techniques.

This invention also relates to a new magnetic sensing mechanism preferably based on a crystalline quartz resonator where acoustic coupling between a mechanical mode of oscillation (induced by a magnetic field to be sensed) and a piezoelectric mode of oscillation (induced by an applied AC current) enables the sensor to detect the magnetic field through the applied Lorentz force.

BACKGROUND

Prior art involving silicon resonant magnetometers suffer from poor sensitivity and moderate detection limits above 1 µT. In contrast, autonomous navigation systems that use position, navigation, and time units (PNTs) in conjunction with GPS applications need sensitive magnetometers wherein a minimum desired detection angle of 0.1° (in terms of resolving capability) translates to a minimum detectable magnetic field of under 50 nT.

Additionally, prior art silicon resonators are known to exhibit high temperature dependence, resulting in low stability of the measurement, whereas quartz resonators can be manufactured in various temperature-insensitive crystal cuts (AT cuts and SC cuts are preferred). Moreover, he high stability of co-fabricated MEMS quartz oscillators can be exploited to stabilize the measurement of the MEMS magnetometer. So a MEMS quartz oscillator may be advantageously disposed on the same substrate as the magnetometer disclosed herein.

The prior art includes: "Development of Miniature Magnetometers" Dennis K. Wickenden, Thomas J. Kistenmacher, Robert Osiander, Scott A. Ecelberger, R. Ben Givens, and John C. Murphy, *Johns Hopkins APL Technical Digest*, Vol. 18, Num. 2 (1997) 271.

This prior art achieves good detection sensitivity but utilizes a large (>4 mm) xylophone beam. High drive currents (>1A) prevent widespread use in portable and low power devices. The material of choice does not lend this prior art device to be easily integrated with electronics or other sensors. The present invention is based on a quartz MEMS fabrication process which is the subject of U.S. Pat. No. 7,830,074 identified above which has already demonstrated wafer-level integration with electronics.

The prior art also includes:

"A Resonant Micromachined Magnetic Field Sensor," Behraad Bahreyni, and Cyrus Shafai, *IEEE Sensors Journal*, VOL. 7, NO. 9, SEPTEMBER 2007

"A resonant magnetic field microsensor with high quality factor at atmospheric pressure," A L Herrera-May, P J Garcia-Ramirez, L A Aguilera-Cortes, J Martinez-Castillo, A Sauceda-Carvajal, L Garcia-Gonzalez, and E Figueras-Costa, *J. Micromech. Microeng.* 19 (2009) 015016 (11pp)

"Low Power 3-axis Lorentz Force Navigation Magnetometer," M. J. Thompson, M. Li, and D. A. Horsley, MEMS 2011, Cancun, Mexico, Jan. 23-27, 2011.

"Micromechanical magnetometer using an all-silicon non-linear torsional resonator," D. Antonio, M. I. Dolz, and H. Pastoriza, *Applied Physics Letters* 95, 133505 2009.

The prior art mentioned above uses silicon resonant structures whose frequency shifts in the presence of a changing magnetic field. While silicon devices can easily be integrated with on-chip electronics, they are prone to large frequency-temperature drifts. Prior art often requires external and often separate drive and detection schemes which increases the complexities and noise. We design the drive and sense mechanisms directly onto the sensing structure enabling a more compact sensor footprint and reduced parasitics. Additionally, directly coupling between the drive and sense mechanisms of our invention greatly improves SNR.

In one aspect the present invention provides a magnetometer comprising a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop, first and second oscillator circuits, the first oscillator circuit being coupled to said loop for applying an oscillating current to said loop, the oscillating current having a frequency essentially equal to the resonant frequency of the first mode of the resonating structure, the second oscillator circuit being coupled to said sense electrodes, the second oscillator circuit oscillating with a fundamental frequency corresponding to the resonant frequency of the second mode of the resonating structure, the second oscillator also producing sidebands indicative of the magnetometer sensing an external magnetic field.

In another aspect the present invention provides a resonating structure formed of a beam of dielectric material, the beam of dielectric material being naturally resonant in at least first and second resonant modes, wherein the first resonant mode is a flexure mode and the second resonant mode is a thickness shear mode, a resonant frequency of the thickness shear mode being at least an order of magnitude greater than a resonant frequency of the flexure mode, the resonating structure having two sense electrodes disposed on opposing major surfaces of the resonating structure and having a conductive path formed as a loop on said beam of dielectric material, the loop being disposed near or at edges of the beam of dielectric material and the two sense electrodes being formed inwardly of the loop.

In yet another aspect the present invention provides a magnetometer comprising a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop, an oscillating device coupled to said loop for applying an oscillating current to said loop, the oscillating current having a frequency at least within a bandwidth of a flexure mode frequency of the resonating structure, and an oscillator sustaining circuit coupled to said sense electrodes, the oscillator sustaining circuit oscillating with a fundamental frequency corresponding to the resonant frequency of the second resonant mode of the resonating structure, the oscillator sustaining circuit also producing sidebands indicative of the magnetometer sensing an external magnetic field.

In still yet another aspect the present invention provides a method of sensing a magnetic field using a crystalline quartz resonator disposed in said magnetic field, the method including inducing acoustic coupling between a mechanical mode of oscillation of said resonator caused by the magnetic field to be sensed and a piezoelectric mode of oscillation induced by applying an AC voltage to sense electrodes disposed on opposing sides of the quartz resonator and applying an AC current to a loop conductor disposed on said crystalline quartz resonator which enables the crystalline quartz resonator to sense the magnetic field due to sidebands which occur in said AC voltage which sidebands are indicative of the sensing the magnetic field through a resulting Lorentz force.

In yet another aspect the present invention provides a method of sensing a magnetic field using a quartz resonator disposed in said magnetic field, the method comprising: applying an RF signal to sense electrodes disposed on opposing sides of the quartz resonator thereby inducing the quartz resonator to vibrate in a shear mode of vibration at a fundamental frequency of $f_{t.s.}$, applying an AC signal, having a substantially lower frequency $f_{flex}$ than the frequency $f_{t.s.}$ of the RF signal, the AC signal being applied to at least one loop electrode disposed on the quartz resonator, and disposing the quartz resonator with the AC signal applied to the at least one loop conductor and the RF signal applied to the sense electrodes in the magnetic field to be sensed, the magnetic field interacting with the AC signal in the at least one loop conductor to drive the quartz resonator in a flexure mode of oscillation at the frequency $f_{flex}$, the flexure mode of oscillation of the quartz resonator acoustically coupling with the shear mode of vibration to induce one or more sidebands in the AC signal, the at least one sideband having an amplitude which is related at least in part to an intensity of the magnetic field sensed by the quartz resonator.

BRIEF DESCRIPTION OF THE INVENTION

The present invention differentiates itself from other MEMS-based magnetic sensors in part due to the intrinsic material properties of the material selected for use in magnetic sensor. The preferred material is currently quartz although it does appear that other materials may be substituted for quartz but sometimes with certain disadvantages appearing with other material choices. But since quartz appears to perhaps be the optimum material for the magnetic sensors this disclosure will assume for the most part that quartz is being utilized for the cantilevered beam 10 used in the disclosed magnetic sensor.

Since the modal frequency of the thickness shear mode is a function of the quartz thickness and if the micro-fabrication process utilized allows one fashion the quartz to be used for the cantilevered beam with a thicknesses approaching 1 μm, corresponding to frequencies close to 1 GHz. Such a high resonant frequency renders a quartz magnetometer utilizing the disclosed sensor to be advantageously insensitive to low frequency mechanical vibrations. Additionally, by designing the quartz cantilevered beam of the present magnetometer with a desirable quartz crystallographic orientation (an AT-cut quartz crystal is desirable, but other cuts such as an SC-cut may be utilized if desired) and by utilizing temperature compensation circuits, the thermal stability of the disclosed magnetometer is enhanced. As a diamagnetic material the disclosed quartz resonant magnetometer does not appear to exhibit any adverse magnetic effects such as hysteresis or saturation. With proper design and vacuum packaging, the disclosed quartz micro-magnetometer may well demonstrate detection limits in the range of 1 nT, making the disclosed quartz magnetometer ideally suited for high precision navigation and geolocation.

While traditional capacitive and optical detection schemes have been used in prior art to indirectly measure magnetic fields, capacitive detection can be sensitive to environmental conditions and require complex electronics. Optical detection is difficult to integrate and even harder to miniaturize. The present invention relies on the internal coupling of two resonant modes to detect the magnetic field which can be sensed via the piezoelectric effect found in crystalline quartz for example. Piezoelectric coupling is among the most efficient means to sense vibrations, resulting in a high Signal-to-Noise Ratio (SNR).

In one aspect the present invention provides a magnetometer comprising a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop, first and second oscillators, the first oscillator being coupled to said loop for applying an oscillating current to said loop, the oscillating current having a frequency essentially equal to the resonant frequency of the first mode of the resonating structure, the second oscillator being coupled to said sense electrodes, the second oscillator oscillating with a fundamental frequency corresponding to the resonant frequency of the second mode of the resonating structure, the second oscillator also producing sidebands indicative of the magnetometer sensing an external magnetic field.

In another aspect the present invention provides a resonating structure formed of a beam of dielectric material, the beam of dielectric material being naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop on said beam of dielectric material, the loop being disposed near or at edges of the beam of dielectric material and the two sense electrodes being formed inwardly of the loop.

BRIEF DESCRIPTION OF THE DRAWINGS

FIG. 2*a* is a SEM image and while

FIGS. 4*a* and 4*b* show embodiments of sensing circuits which may be utilized with the disclosed quartz MEMS micro-resonator, FIG. 4*a* being a block diagram while FIG. 4*b* is a schematic diagram showing greater detail.

DETAILED DESCRIPTION

Lorentz Force Sensing

Figure 1:
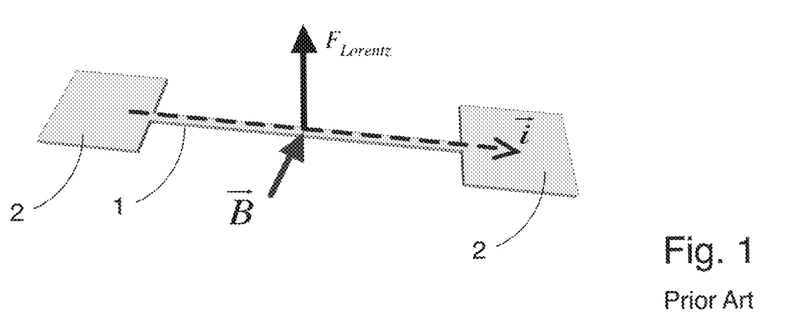
FIG. 1 depicts the basic design of a Lorentz-based resonant magnetometer with the magnetic Lorentz force deflecting the doubly-clamped mechanical beam.

FIG. 1 shows the basic principle behind a conventional Lorentz-force magnetometer. In the depicted configuration, the magnetometer consists of a suspended doubly-clamped beam 1 that is anchored at both ends 2. An alternative design would comprise a singly-clamped cantilever beam (not shown) anchored at one end instead of both ends. Singly-clamped magnetometer are also known in the prior art. See R. Sunier, T. Vancura, Y. Li, K.-U. Kirstein, H. Baltes, and O. Brand, "Resonant Magnetic Field Sensor With Frequency Output," J. MEMS, vol. 15, no. 5, pp. 1098-1107, October 2006.

The external magnetic field $\vec{B}$ interacts with the current $\vec{i}$ that flows along the length of the beam. The coupling between the $\vec{B}$ field and the current $\vec{i}$ generates a Lorentz magnetic force $\vec{F}_{Lorentz}$ directed perpendicular to both the magnetic field $\vec{B}$ and current flow $\vec{i}$ as described by Eqn. 1 below where $\vec{i}$ is the current, L is the length of the current line, and $\vec{B}$ is the magnetic field strength:

$$F_{Lorentz} = \vec{i} L \times \vec{B} \qquad \text{Eqn. (1)}$$

An increase in either the drive current or current length generates larger forces and greater deflection for increased sensitivity and a lower detectable field limit. In the prior art, the amount of beam deflection that occurs as a result of the Lorentz force is normally measured capacitively or optically by an appropriate sensor to ascertain the strength of the magnetic field causing the beam 1 to deflect.

Figure 4A:
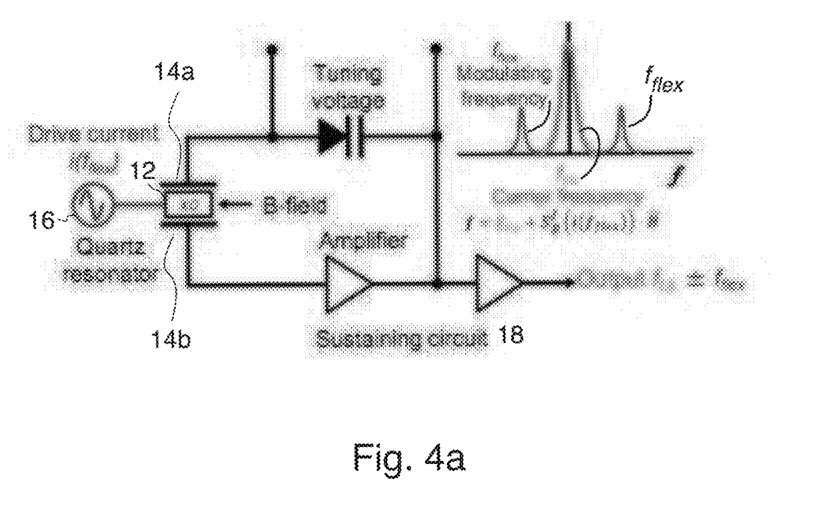
Figure 4B:
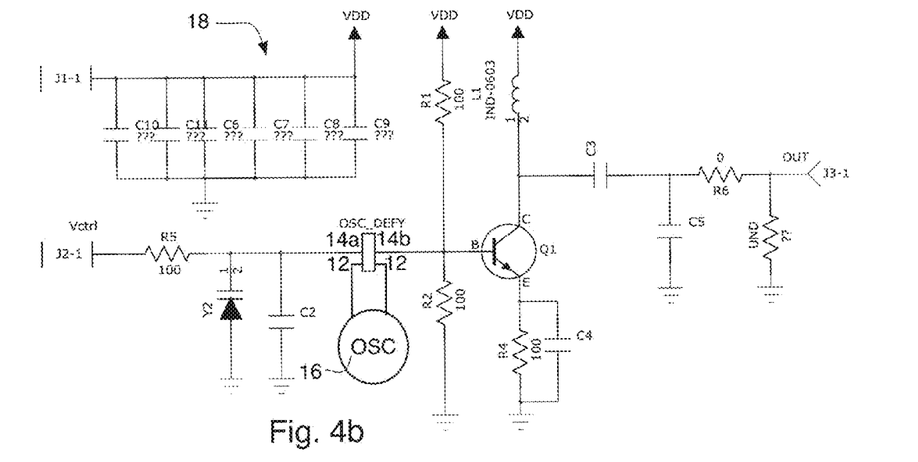

Further improvement in sensitivity can be achieved when a sensor is driven into resonance by an AC drive current applied to a loop 12 (see FIG. 2*b*), the applied AC having an actuation frequency which desirably matches the beam's flexure mode frequency. The AC current applied to loop 12 is preferably generated by a first oscillator circuit 16 connected to loop 12 as is depicted by FIGS. 4*a* and 4*b*. At resonance, the beam deflection $d_{AC}$ (deflection $d_{AC}$ is the deflection measured at the tip (free end) of a cantilever beam—when the beam is vibrating under flexure mode resonance (the beam vibrating up and down normal to its major surface at resonance)—this deflection can be much larger than the DC deflection $d_{DC}$ of the beam under an equal static force) is a function (see Eqn. 2 below) of the actuation frequency f, the flexure mode frequency $f_{flexure}$ of the beam and the quality factor or Q of the beam. A beam with a higher Q tends to enhance the sensitivity of the resulting magnetometer proportionally compared to a beam with a relatively lower Q. A quartz beam should have higher intrinsic Q compared to a silicon beam, for example, and therefor a quartz beam would be preferred compared to a silicon beam in most applications.

$$d_{AC}(f) = \frac{d_{DC}}{\sqrt{\left(1 - \frac{f^2}{f_{flexure}^2}\right)^2 + \left(\frac{1}{Q}\frac{f}{f_{flexure}}\right)^2}} \rightarrow d_{AC}(f_{flexure}) = Q d_{DC} \qquad \text{Eqn. (2)}$$

where $d_{DC}$ is the static deflection of the beam, f is the drive frequency and $f_{flexure}$ is the mechanical resonant frequency of the beam.

Note should be made of the different orientation of the B field to be measured by the disclosed magnetometer compared to the orientation of the B field of the prior art device of FIG. 1.

As the drive frequency of the applied AC approaches the beam's flexure mode frequency, the AC deflection equation (Eqn. 2) reduces to the product of the DC deflection ($d_{DC}$) and the quality factor (Q). Vacuum packaging increases the quality factor (Q) by allowing a MEMS magnetometer to operate with greater deflection at low pressure without viscous damping. As such, the disclosed magnetometer is preferably packaged so that it can operate in a vacuum environment. So, if one drives the beam's loop 12 with an AC signal whose drive frequency matches the frequency of the beam's natural mechanical resonance, then the deflection with AC drive will be the static deflection (from a DC drive signal) amplified by the Q of the beam. Ideally, the desired frequency match is perfect. But in real life, few things are perfect and hence the frequency of the AC drive current must at least be within the bandwidth of the flexure mode frequency (where its bandwidth is inversely proportional to the Q of the beam) for a match to occur.

Quartz Resonant Magnetometer Operation Principal

Figure 2A:
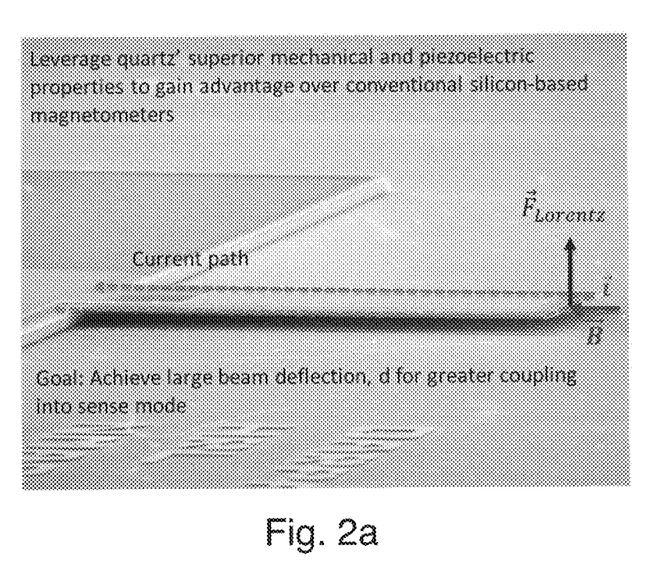
Figure 2B:
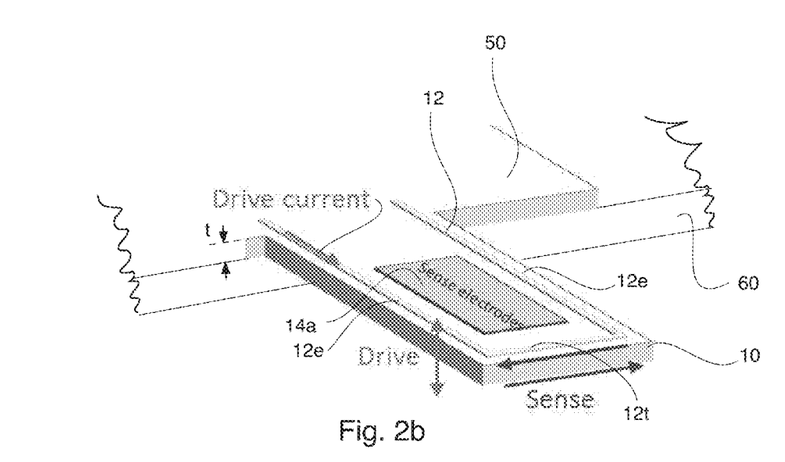
FIGS. 2*b* and 2*c* are a schematic drawings of a UHF quartz cantilevered resonator of the present invention showing out-of-plane Lorentz force due to coupling between the B-field and the current flow, FIG. 2*b* being a perspective view while FIG. 2*c* being a side elevational view.
Figure 2C:
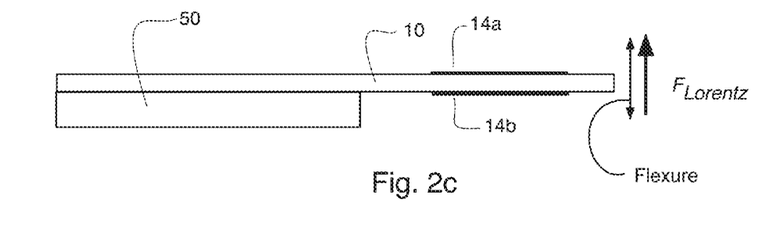

In one aspect, the present invention provides a micro-magnetometer which is preferably based on the MEMS quartz micro-resonator shown in FIGS. 2*a*, 2*b*, 2*c* and in the attached Appendix A. The MEMS quartz micro-resonator has a resonating structure provided by a quartz cantilever 10 which is preferably fixed (thus clamped) at one end of same where it is preferably integrally connected to a wider quartz base 50 which in turn may be directly anchored to a substrate 60 which may be made of silicon for example. The fabrication of the quartz resonant magnetometer depicted in FIG. 2a preferably mirrors the apparatus and process that is described in the US patent "Method for Fabricating a Resonator," U.S. Pat. No. 7,830,074 noted above, but with additional metal patterns disposed along the two parallel side edges (see metal 12e) and along the tip (see metal 12t) of the quartz cantilever 10 thereby forming an electrically conductive loop 12 (preferably comprising two metal segments 12e and one metal segment 12t) for conducting the AC current loop when a appropriate current (the AC signal mentioned in the preceding paragraph) is applied to the electrically conductive loop 12.

Opposing sense electrodes 14a and 14b are formed, preferably of metal, on the quartz cantilever 10, one of which (sense electrode 14a) is depicted in FIG. 2b disposed on the upper surface of the quartz cantilever 10. There is another sense electrode 14b, opposing sense electrode 14a, disposed on the lower surface of the quartz cantilever 10 (see FIG. 2c). The two opposing sense electrodes 14a and 14b are surrounded by the current loop formed by the electrically conductive loop 12 (which metal pattern 12 is not shown in FIG. 2c for ease of illustration). The current loop formed by the electrically conductive loop 12 is shown disposed on an upper surface of the quartz cantilever 10 in FIG. 2b. The current loop formed by the metal pattern 12 may be disposed only on the upper surface of the quartz cantilever 10 or the current loop formed by the metal pattern 12 may be disposed on both the upper and lower surfaces of the quartz cantilever 10, with the two loops then being connected preferably in parallel with each other. If two loops 12 are formed, then of course there are four metallic segments 12e along the parallel edges of the quartz cantilever 10 and two metallic segments 12t along the tip of the quartz cantilever 10. Also, the current loop formed by the electrically conductive loop 12 may alternatively be formed only on the lower surface of the quartz cantilever 10 if desired.

The dimensions of the quartz beam 10 will vary depending upon the application in which it is used as well as upon environmental conditions. Beam 10 thickness (t) will affect the frequency of the sensing mode (thickness-shear). Currently, beams are being developed having a nominal thickness of about 2-3 µm thick, but such a thickness may not necessarily be optimum. In terms of the specific embodiment shown in FIG. 3, the beam 10 has a thickness (t) of 2.2 µm, a length of 235.0 µm and a width of 105.0 µm. The width of the beam does not seem to be particularly critical in terms of affecting the thickness-shear mode frequency, so long as the sense electrodes 14a and 14b and drive current loop 12 are able to fit within an available area on the beam. But the width of the beam 10 is important for other reasons which are discussed below. Typically the cantilevered beam 10 is beam-like, that is, longer than it is wide. But that is not necessarily the case as a longer beam does allow more deflection but possibly at a cost of a lower Q, so there may be some engineering trade offs be made in this regard.

Mode Coupling Between Drive and Sense

In FIGS. 2a and 2b the drive current runs along a loop conductor 12 disposed at or near the perimeter of the cantilever 10, the conductor 12 preferably continuing onto the quartz base 50. The drive current for loop conductor 12 is produced by an oscillator 16 depicted by FIGS. 4a and 4b. Oscillator 16 generates a drive current $i(f_{flex})$ which is applied to loop conductor 16. Turning again to FIGS. 2a and 2b, the current and magnetic field vectors are oriented such that the resultant Lorentz force is directed through the quartz thickness in the out-of-plane axis as shown in FIGS. 2a and 2c. With the AC drive current $i(f_{flex})$ running in opposite directions in edge segments 12e on either side of the cantilevered beam 10, the net Lorentz force resides along the free end due to segment 12t at the tip of the cantilever beam 10. The thickness (t) of the quartz cantilever 10 and the base 50 is preferably selected to be significantly smaller than either the width or length of the cantilevered quartz beam 10 to ensure the greatest amount of deflection and force sensitivity in the out-of-plane direction while maintaining good isolation along the other two axes. In the specific embodiment of FIG. 3, the thickness (t) is at least 50 times smaller that either of the other two dimensions. The flexure mode frequency can then be expressed as a function of the quartz thickness (t) and the beam length (L) knowing the Young's modulus of Quartz (E) and the density of Quartz (ρ) as follows:

$$f_{flexure} = \frac{1}{2\pi}\sqrt{\frac{2Et^2}{2\rho L^4}} \qquad \text{Eqn. (3)}$$

At the same time the AC current in the loop 12 and the magnetic field drives the beam into flexure mode resonance, the quartz resonator also undergoes resonance in the thickness shear between the top and bottom conductive sense electrodes 14a and 14b. An RF signal is applied between the opposing sense electrodes 14a and 14b which induces thickness shear acoustic waves that propagate through the thickness of the quartz volume bounded by the sense electrodes 14a and 14b. If one looks at the Lorentz force equation, the force is directional and depends on the vector of both the current and B-field. The B-field will always be along one direction (see FIG. 1). But the currents in the loop 12 along the opposing edges of the cantilever 10 are in opposite directions so the Lorentz force generated along both sides are pointed in opposite directions thus will cancel each other leaving only the Lorentz force generated by the AC drive current $i(f_{flex})$ in loop segment 12t along the tip of the free end of beam 10. The thickness shear mode frequency $f_{t.s.}$ is dictated by the quartz density ρ, thickness t of the quartz cantilever 10 and the elastic coefficient $c_{66}$ which varies depending on the cut of quartz. See Eqn. (4) below. Thus the invention can be further optimized by selecting the optimum cut with the desired elastic coefficient.

$$f_{t.s.} = \frac{1}{2t}\sqrt{\frac{c_{66}}{\rho}} \qquad \text{Eqn. (4)}$$

Figure 3:
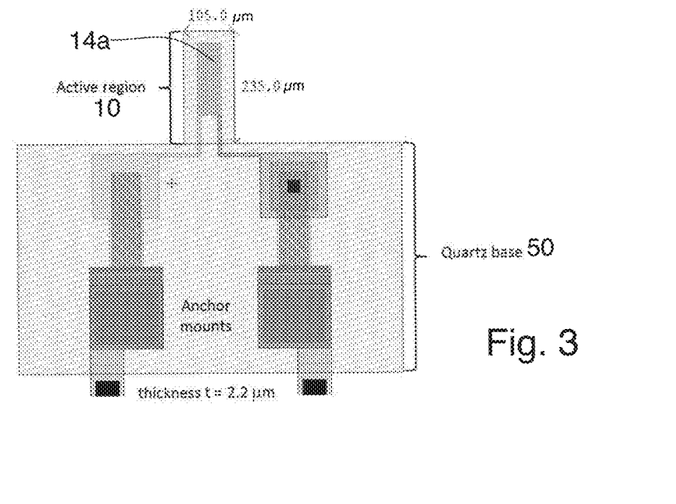
FIG. 3 is a top-down layout of a specific embodiment of the quartz MEMS micro-resonator.

The sensing mechanism of the magnetometer is based on acoustic coupling between two resonance modes where one mode is driven into mechanical vibration by the Lorentz force and a second higher frequency thickness shear mode detects the low-frequency vibration and resultant bending strain in the form of a frequency shift. With the sustaining amplifier loop 18 of FIG. 4a or 4b closed across the opposing sense electrodes 14a and 14b but no current excitation along the current loop 12, the quartz magnetometer resonates at the thickness shear mode frequency $f_{t.s.}$ and outputs a carrier signal (the peak at $f_{t.s.}$ in FIG. 3a) that is unperturbed by the external magnetic field. Once the AC drive current $i(f_{flex})$ is applied to loop 12 and interacts with the external magnetic field $\vec{B}$, the generated Lorentz force $\vec{F} = i(f_{flex})L \times \vec{B}\square$ (see also Eqn. 1) at the tip of the resonator drives the plate into mechanical vibration at the fundamental flexural mode frequency $f_{flex}$. This flexural motion modulates the stiffness of the active thickness shear region due to strain sensitivity of the quartz elastic moduli of the quartz cantilever, resulting in frequency modulation of the thickness shear mode and FM sidebands signals (shown in FIG. 4a) offset at $f_{flex}$ from either side of the thickness shear frequency $f_{t.s.}$. The amplitude of the sideband signals is a function of the resonator frequency, sensitivity $S_B^f$, drive current $i(f_{flex})$ and external magnetic field $\vec{B}$.

Force Detection Demonstration

The beam deflection of the quartz magnetometer can be detected by several means including capacitive and optical. However, employing a quartz resonator as a sensor provides yet an additional detection scheme through the coupling between the drive (flexure) mode and the sensing (thickness shear) mode. The coupling between these two modes is the result of the longitudinal stress induced by the flexing cantilevered beam 10. The bending stress alters the overall beam dimensions and the stiffness coefficient $c_{ij}$. Changes to these two parameters shift $f_{t.s.}$ by a detectable amount. By implementing an oscillator sustaining circuit 18 around the quartz micro-magnetometer, one can easily monitor $f_{t.s.}$. The oscillator sustaining circuit 18 forms a second oscillator which outputs a carrier at $f_{t.s.}$ with upper and lower side bands spaced from the carrier by $F_{flex}$, where $F_{flex}$ is the frequency of the AC drive current in loop 12, which frequency must at least be within the bandwidth of the flexure mode frequency of the beam 10 (where its bandwidth is inversely proportional to the O of the beam 10).

Sensing Demonstration

We demonstrated the operating principle of this invention by evaluating the force sensing capability of a specific embodiment of a quartz micro-resonator whose layout is shown in FIG. 3. The quartz active region for this evaluation comprised a embodiment of the quartz cantilever 10 having dimensions of 105.0 by 235.0 µm. The cantilevered micro-resonator of FIG. 3 has a thickness of 2.2 µm and a $f_{t.s.}$ of 705 MHz. The fully packaged resonator die was soldered onto an oscillator circuit board on substrate 50 which was in turn mounted to a shaker table for this evaluation where the resonator on the cantilevered beam 10 was subjected to a sinusoidal acceleration force serving as a surrogate for a magnetic force. The minimum detectable acceleration force extracted from this experiment can be converted to a minimum detectable magnetic field by the equation (Eqn. (5)) below where x is the distance from the fixed edge to the center of the electrode, t is the plate thickness, I is the moment of inertia, m is the plate mass, and L is the beam length and w is the beam width.

$$a_{min}\frac{mt}{8IL}(2Lx - L^2 - x^2) = \bar{B}_{min}\frac{iwt}{2I}(x - L) \quad \text{Eqn. (5)}$$

The $f_{t.s.}$ shift response to the induced force is reflected in a jump in the phase noise measurement at an offset frequency matching that of the acceleration force. A peak in the phase noise was found at 9 kHz. The relationship between the resonator's phase noise, the flexure frequency, and acceleration is expressed below:

$$L = 20\log\left(\frac{\Gamma \times a \times f_{t.s.}}{2f_{vib}}\right) \quad \text{Eqn. (6)}$$

The sensitivity $\Gamma$ is intrinsic to the quartz resonator and affects the magnitude of the frequency shift in response to an induced force on the resonator. We shall see in the later part of this disclosure that $\Gamma$ is directly related to the beam stress. From the phase noise vs. acceleration plot in FIG. 5a the noise floor of the resonator in the absence of a force is −138 dBc. We can then extrapolate the minimum acceleration (0.048 g) that can be detected by this resonator by assuming a phase noise of 3 dB above this noise floor. We also determined that the resonator has an acceleration sensitivity of $5.63 \times 10^{-11}$/g at 9 kHz offset.

Beam Stress and Acceleration Sensitivity

We compared the analytical model of longitudinal stress on a quartz cantilever beam with a Finite Element Model (FEM) model of the force sensitivity for the same beam. The results were used to optimize the beam dimensions, particularly the beam length and thickness to maximize the resultant frequency shift for a given force. The results in FIG. 5b show excellent agreement between the analytical model of beam stress and the FEM model of acceleration sensitivity. Both the stress and the acceleration sensitivity is a linear function of the beam length. As one designs longer beams, the sensitivity and beam stress increase proportionately.

Figure 5A:
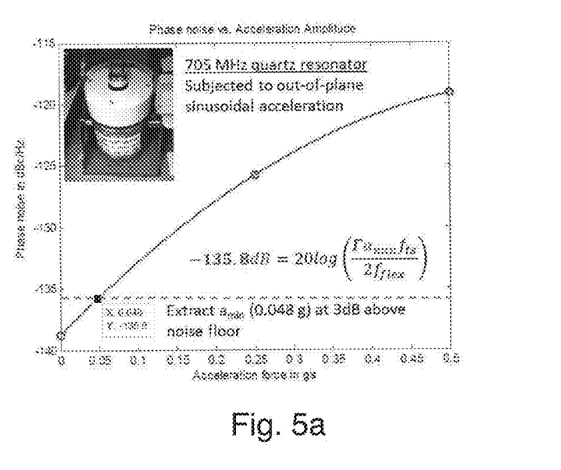
FIG. 5*a* depicts phase noise of the quartz resonator with excitation frequency of 9 kHz and varying acceleration.
Figure 5B:
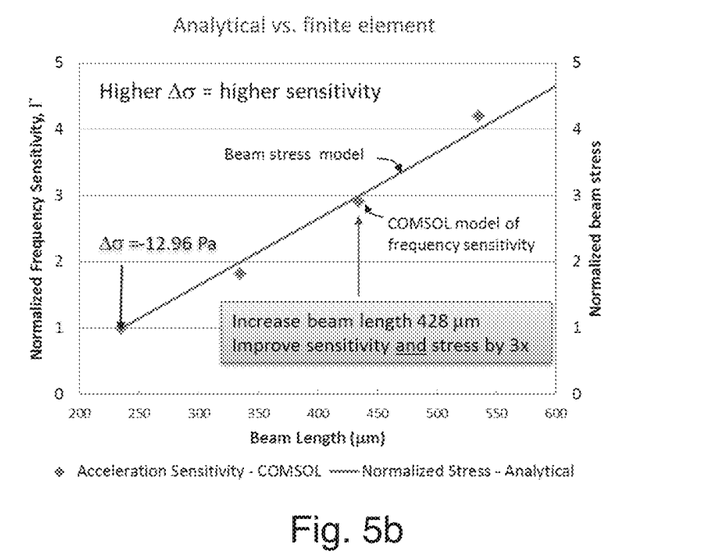
FIG. 5*b* depicts overlaid plots of normalized stress (red) and acceleration sensitivity (blue) shows excellent agreement between the analytical and a Finite Element Model (FEM) model.
Figure 6:
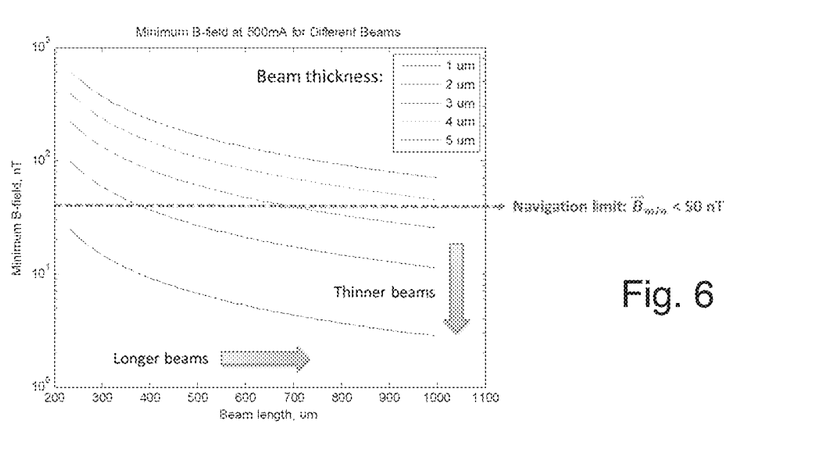
FIG. 6 shows the minimum detectable magnetic field for various beam lengths and thicknesses.

Given the minimum acceleration and resultant stress values from FIGS. 5a and 5b, we can parameterize the quartz micro-magnetometer design to obtain the lowest possible detection limit of the magnetic field. FIG. 6 shows the minimum detectable magnetic field for various beam lengths and thicknesses. To achieve B-field detections below 50 nT for navigation-grade heading referencing, the quartz magnetometer should comprise of a thinner and/or longer beam than what was measured on the phase noise plot. The plot shows the possibility to achieving field detection limit as low as 5 nT with further reduction in this value when operating under vacuum and high Q.

Addition technical information regarding the disclosed sensor and regarding a prototype sensor built using this technology can be found in Appendix A hereto. Appendix A is hereby incorporated herein by reference.

This concludes the description of embodiments of the present invention. The foregoing description of these embodiments has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:

1. A magnetometer comprising a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop, first and second oscillator circuits, the first oscillator circuit being coupled to said loop for applying an oscillating current to said loop, the oscillating current having a frequency essentially equal to the resonant frequency of the first mode of the resonating structure, the second oscillator circuit being coupled to said sense electrodes, the second oscillator circuit oscillating with a fundamental frequency corresponding to the resonant frequency of the second mode of the resonating structure, the second oscillator also producing sidebands indicative of the magnetometer sensing an external magnetic field.

2. A magnetometer as claimed in claim 1 where a resonating structure is constructed from a piezoelectric material.

3. A magnetometer as claimed in claim 2 where the piezoelectric material is single crystal quartz.

4. A magnetometer as claimed in claim 3 where the resonating beam is anchored to a substrate a proximate end thereof and free at a distal end thereof.

5. A magnetometer as claimed in claim 1 where the sense electrodes are positioned near a fixed end of the resonating beam.

6. A magnetometer as claimed in claim 1 wherein the oscillating current applied to said loop and the external magnetic field generate an out-of-plane force on the resonating structure.

7. A magnetometer as claimed in claim 6 where the resonating structure exhibits flexure-mode mechanical vibration in response to the oscillating current applied to said loop and the external magnetic field.

8. A magnetometer as claimed in claim 7 wherein the first resonant mode of the resonating structure is a flexure mode and the second resonant mode of the resonating structure is a thickness shear mode.

9. A magnetometer as claimed in claim 8 where the mechanical vibration of the resonating structure induces bending stress/strain which is detected with the higher frequency thickness shear mode via a frequency change of said second oscillator.

10. A magnetometer as claimed in claim 3 where the crystallographic orientation of the quartz material is chosen to provide an optimal or minimal slope frequency-temperature characteristic.

11. A magnetometer as claimed in claim 9 where increasing the quality factor of the flexure mode of the resonating structure proportionally enhances the sensitivity of the magnetometer.

12. A magnetometer as claimed in claim 9 wherein the resonating structure has a major axis and wherein the frequency change is proportional to the magnitude of external magnetic field in direction parallel to said major axis of the resonating structure.

13. A resonating structure formed of a beam of dielectric material, the beam of dielectric material being naturally resonant in at least first and second resonant modes, wherein the first resonant mode is a flexure mode and the second resonant mode is a thickness shear mode, a resonant frequency of the thickness shear mode being at least an order of magnitude greater than a resonant frequency of the flexure mode, the resonating structure having two sense electrodes disposed on opposing major surfaces of the resonating structure and having a conductive path formed as a loop on said beam of dielectric material, the loop being disposed near or at edges of the beam of dielectric material and the two sense electrodes being formed inwardly of the loop.

14. A resonating structure as claimed in claim 13 where the beam of dielectric material is formed from a piezoelectric material.

15. A resonating structure as claimed in claim 14 where the piezoelectric material is single crystal quartz.

16. A resonating structure as claimed in claim 15 where the beam of dielectric material is anchored to a substrate at a proximate end thereof and free at a distal end thereof.

17. A magnetometer comprising a resonating structure which is naturally resonant in at least first and second resonant modes, a resonant frequency of the second mode being at least an order of magnitude greater than a resonant frequency of the first mode, the resonating structure having two sense electrodes disposed on opposing major surfaces of the resonating structure and having a conductive path formed as a loop, the loop being disposed near or at edges of the resonating structure and the two sense electrodes being formed inwardly of the edges of the resonating structure and also inwardly of said loop, an oscillating device coupled to said loop for applying an oscillating current to said loop, the oscillating current having a frequency at least within a bandwidth of a flexure mode frequency of the resonating structure, and an oscillator sustaining circuit coupled to said sense electrodes, the oscillator sustaining circuit oscillating with a fundamental frequency corresponding to the resonant frequency of the second resonant mode of the resonating structure, the oscillator sustaining circuit also producing sidebands indicative of the magnetometer sensing an external magnetic field.

18. The magnetometer of claim 17 wherein the first resonant mode is a flexure mode and the second resonant mode is a thickness shear mode.

19. The magnetometer of claim 17 where the resonating structure comprises a single crystal quartz beam.

20. A method of sensing a magnetic field using a crystalline quartz resonator disposed in said magnetic field, the method including inducing acoustic coupling between a mechanical mode of oscillation of said resonator caused by the magnetic field to be sensed and a piezoelectric mode of oscillation induced by applying an AC voltage to sense electrodes disposed on opposing sides of the quartz resonator and applying an AC current to a loop conductor disposed on said crystalline quartz resonator which enables the crystalline quartz resonator to sense the magnetic field due to sidebands which occur in said AC voltage which sidebands are indicative of the sensing the magnetic field through a resulting Lorentz force.

21. A method of sensing a magnetic field using a quartz resonator disposed in said magnetic field, the method comprising:
    applying an RF signal to sense electrodes disposed on opposing sides of the quartz resonator thereby inducing the quartz resonator to vibrate in a shear mode of vibration at a fundamental frequency of $f_{t.s.}$,
    applying an AC signal, having a substantially lower frequency $f_{flex}$ than the frequency $f_{t.s.}$ of the RF signal, the AC signal being applied to at least one loop electrode disposed on the quartz resonator, and
    disposing the quartz resonator with the AC signal applied to the at least one loop conductor and the RF signal applied to the sense electrodes in the magnetic field to be sensed, the magnetic field interacting with the AC signal in the at least one loop conductor to drive the quartz resonator in a flexure mode of oscillation at the frequency $f_{flex}$, the flexure mode of oscillation of the quartz resonator acoustically coupling with the shear mode of vibration to induce one or more sidebands in the AC signal, the at least one sideband having an amplitude which is related at least in part to an intensity of the magnetic field sensed by the quartz resonator.

22. The method of claim 21 wherein the shear mode of vibration of the quartz resonator at the fundamental frequency of $f_{t.s.}$ is induced in the quartz resonator due to a piezoelectric response of the quartz resonator to the RF signal applied to the sense electrodes disposed on opposing sides of the quartz resonator and wherein the flexure mode of oscillation of the quartz resonator at the frequency $f_{flex}$ is induced due to a Lorentz force response to both the AC signal applied to the at least one loop conductor and to the magnetic field sensed by the quartz resonator.

\* \* \* \* \*